United States Patent [19]

Lin

[11] Patent Number: 5,366,757
[45] Date of Patent: Nov. 22, 1994

[54] IN SITU RESIST CONTROL DURING SPRAY AND SPIN IN VAPOR

[75] Inventor: Burn J. Lin, Austin, Tex.

[73] Assignee: International Business Machines Corporation, Armonk, N.Y.

[21] Appl. No.: 968,744

[22] Filed: Oct. 30, 1992

[51] Int. Cl.$^5$ .............................................. B05D 3/12
[52] U.S. Cl. ............................................ 427/9; 427/10;
427/240; 427/325; 427/385.5; 118/52; 118/668
[58] Field of Search .................. 427/240, 9, 385.5, 10,
427/325; 118/668, 52

[56] References Cited

U.S. PATENT DOCUMENTS

| | | | |
|---|---|---|---|
| 4,290,384 | 9/1981 | Ausschnitt et al. | 118/722 |
| 4,416,213 | 11/1983 | Sakiya | 118/52 |
| 4,800,836 | 1/1989 | Yamamoto et al. | 118/52 |
| 5,045,417 | 9/1991 | Okamoto | 430/5 |
| 5,250,116 | 10/1993 | Tanimoto | 427/9 |

FOREIGN PATENT DOCUMENTS

| | | |
|---|---|---|
| 60-1248 | 1/1985 | Japan . |
| 2100314 | 4/1990 | Japan . |
| 2113518 | 4/1990 | Japan . |

*Primary Examiner*—Janyce Bell
*Attorney, Agent, or Firm*—Graham S. Jones, II; Dale M. Crockatt

[57] ABSTRACT

Spin coating of resist on a semiconductor wafer is done in a controlled chamber, starting with introducing a resist solvent vapor into the chamber from a nozzle, applying the resist by spraying a very thin layer of the resist material, monitoring and adjusting the resist thickness during spinning in vapor, and then removing solvent from the chamber. The result is a saving in resist material and enhanced coating uniformity.

30 Claims, 2 Drawing Sheets

IN SITU RESIST CONTROL DURING SPRAY AND SPIN IN VAPOR

BACKGROUND OF THE INVENTION

1. Field of the Invention

This invention relates to manufacturing apparatus for use in photolithography, and more particularly to apparatus for to optimizing the quantity of photoresist applied to a substrate.

2. Description of Related Art

In photolithography, photoresist (also usually referred to in the art as resist and referred to both ways herein interchangeably) is deposited upon a work piece to be patterned by the photolithographic process. The expense of the quantity of photoresist used is the most or nearly the most expensive part of the cost of the process currently, depending upon prices of the materials used. Unfortunately, conventional resist spinners waste expensive resist material. In an application to manufacturing of semiconductor wafers, for example, a thick film of photoresist in the form of a puddle millimeters in height is delivered to cover most of a semiconductor wafer. Then the surplus photoresist material is spun off the semiconductor wafer surface, leaving an ultimate thickness of photoresist which is only on the order of several micrometers on the surface of the wafer. A very economical process currently requires 5 ml of photoresist material for each six inch diameter wafer.

U.S. Pat. No. 4,800,836 of Yamamoto et al for "Resist Coating Apparatus" neither introduces nor removes vapor from the chamber in which the resist is dumped on the substrate. No spraying is employed and there is no delay after application.

U.S. Pat. No. 4,416,213 of Sakiya for "Rotary Coating Apparatus" does not control the environment of the deposited resist.

U.S. Pat. No. 4,290,384 of Ausschnitt et al for "Coating Apparatus" suggests use of a mist but no spray and no spinning.

Japanese J6001248-A 85.01.19 (8509) Fujitsu, describes a resist coating method in which the atmosphere of resist solvent vapor is formed adjacent a semiconductor substrate and the resist is coated onto the semiconductor substrate. The solvent is discharged from one side of a porous disc. The resist is dropped onto the substrate. There is no spraying and no savings in resist material.

Japanese J02113518A 90.04.25 (9023) Mitsubishi Denki KK describes a resist coating device with a circular passage to introduce resist mist at a place surrounding the wafer on a spin chuck.

Japanese J02100314A 90.04.12 (9021) NEC Corp. describes an inner wall cup to coat a film of solvent or gas of photoresist.

Copending, commonly assigned U.S. patent application Ser. No. 07/784,290 filed Oct. 29, 1991 of Cardinali and Lin for "A Material Saving Resist Spinner and Process" describes resist coating with the spray-and-spin-in-vapor (SASIV) technique. With SASIV, the resist spin off is done in a vapor-rich environment so that spray resist application can be used to save resist material with a gain in thickness uniformity.

In the past resist thickness has varied even when employing the improvements in SASIV. That is a problem which needs to be overcome. Accordingly, there is a need to eliminate variations which occur with the SASIV process and the like.

In accordance with this invention, resist thickness is monitored and fine tuned in situ to achieve an accurate final thickness independent of variations of resist viscosity, vapor concentration, air flow, spin speed, and many other parameters.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

The technology exists to deliver a coating several micrometers ($\mu$m) thick upon a semiconductor wafer. For example, even so coarse a technology as spray painting could be employed for that purpose broadly. However, the uniformity of thickness and the control of the absolute thickness are far below those required for semiconductor processing.

The process of this invention involves spraying resist upon the work piece to cover it with only a few micrometers of photoresist. At the same time, the photoresist material is prevented from drying rapidly by provision of a controlled environment. A third control feature employed in accordance with this invention is the use of high speed spinning to control the thickness and uniformity of the resist. Because the final step of the process is similar to that used in conventional resist processing, the thickness and uniformity control are performed to at least as good a standard. Their performance are enhanced because the resist can planarize more fully using this process which retains vapor pressure longer.

Figure 1:
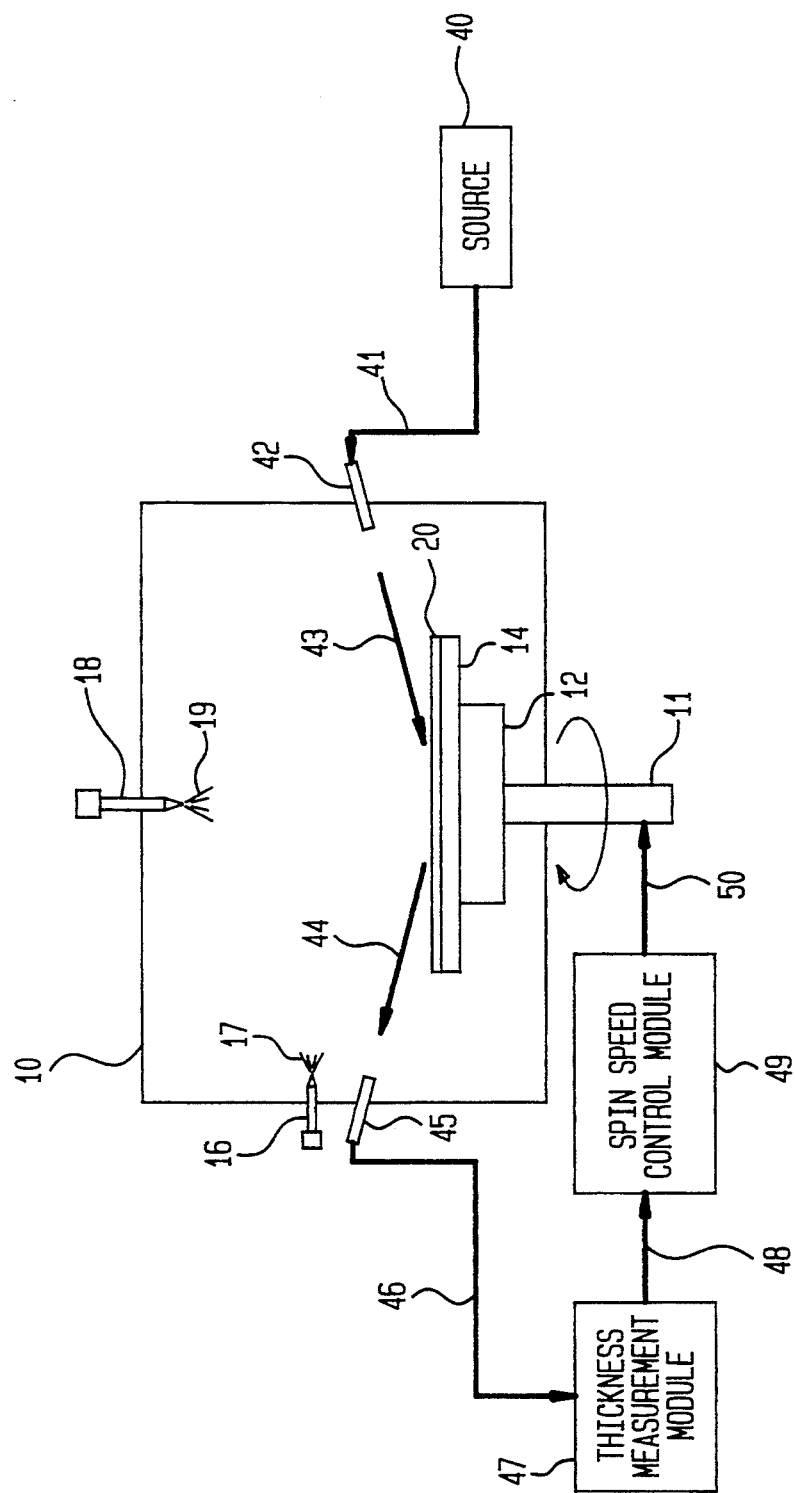
FIG. 1 shows a processing chamber for applying resist to a wafer supported upon a spinner chuck.

FIG. 1 shows an embodiment of a system for practicing the present invention. As described in copending application Ser. No. 07/784,290 a reasonably airtight spinner chamber 10 (i.e. an enclosed, controlled chamber) houses a rotating chuck 12 driven by shaft 11. The chuck 12 carries a work piece, i.e. substrate, in the form of a semiconductor wafer 14. A vaporizing nozzle 16 delivers liquid solvent droplets 17 into chamber 10 for the purpose of preparing the atmospheric concentration of solvent for addition of droplets 19 of photoresist to the chamber 10. This is initiated prior to the step of spray coating liquid photoresist droplets 19 onto wafer 14.

Next, the liquid resist 19 is applied to the wafer 14 from the spray nozzle 18 to form a thin film 20 of resist on the top surface of wafer 14. After the desired uniformity and wet thickness are achieved by spinning, the vapor can be removed from chamber 10 to facilitate proper drying, by a conventional vent (not shown for convenience of illustration, but see FIG. 2 of my copending application Ser. No. 07/784,290). Alternatively, the wafer 14 is relocated to a low vapor environment. Subsequently, the wafer 14 is baked in a conventional manner.

The resist thickness resulting from a spin coating process is dependent on the viscosity of the resist material and the spin speed. There is a well known relationship, $$T \propto \frac{\eta^2}{\sqrt{s}}$$

where
T is the resist thickness,
η viscosity, and
s the spin speed.

In actual practice, other parameters such as the air flow and vapor pressure near the wafer also affect the final resist thickness.

This invention takes advantage of the vapor environment during resist coating with the spray-and-spin-in-vapor (SASIV) technique disclosed in copending U.S. patent application Ser. No. 7/784,290 filed Oct. 29, 1991 of Cardinali and Lin for "A Material Saving Resist Spinner and Process." With SASIV, the resist spin off is done in a vapor-rich environment so that spray resist application can be used to save resist material with a gain in thickness uniformity. Here, the resist thickness reproducibility is improved by monitoring the resist thickness in the initial phase of the spin cycle uses a spin speed that is slightly lower than the target speed for the final thickness. This lower spin speed makes the resist thickness slightly larger than target. Because the resist is still completely wet in the vapor-rich environment, the spin speed can be fine tuned according to in situ measurements taken during the initial phase of the spin cycle.

Any thin-film thickness measurement technique can be used. Referring again to FIG. 1, in accordance with this invention, the wafer chamber 10 has a source 40 of light, connected by fiber optic line 41 to a light sender 42 adapted to resist thickness measurement and beam 43 hits the resist film 20 and is reflected as beam 44 directed at light receiver 45 comprising an optical element adapted for resist thickness measurement. The sender 42 and the receiver 45 employ polychromatic interferometry to monitor the resist thickness. This thickness information is used to fine tune the spin speed for the target resist thickness. The output of receiver 45 is an electronic signal which passes on electrical cable 46 to thickness measurement module 47. Module 47 performs signal analysis of standard thin film thickness measurement techniques to calculate the resist thickness, as done by the prometrix thin film thickness measurement tool.

The thickness measurement module 47 supplies signals on line 48 to spin speed control module 49, which controls a variable drive motor (indicated by line 50) attached to shaft 11.

Figure 2:
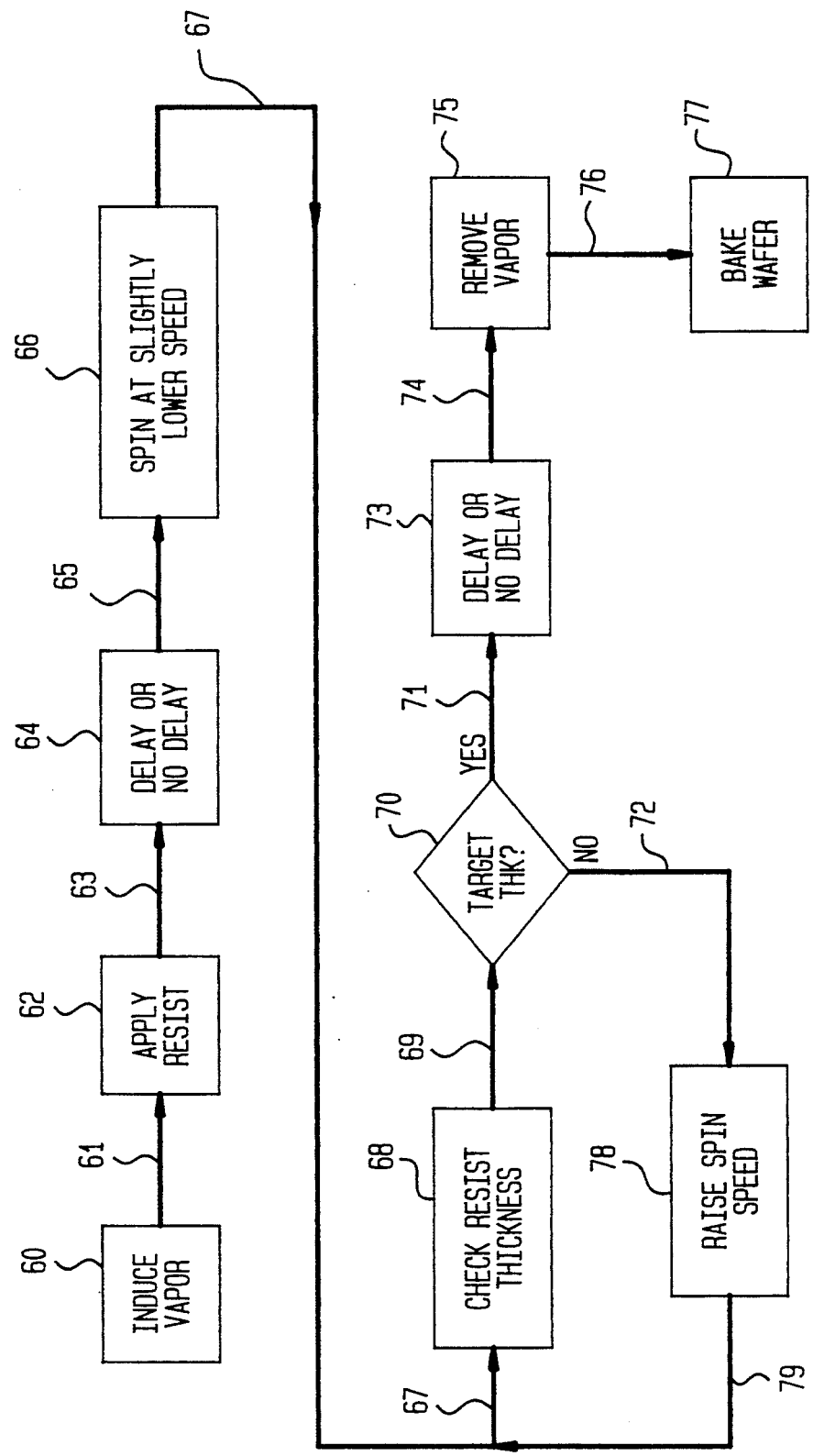
FIG. 2 shows a flow chart of the system and process of this invention.

A typical process sequence is shown in the flow chart in FIG. 2. After the vapor spray 60 and resist spray 62 steps and the start of spinning 66 as in SASIV, the resist thickness is measured 68. Then the spin speed 78 can be increased according to the measured thickness 68 depending upon the decision on target thickness 70. With the spin speed increased but still slightly below the predicted speed, this cycle can be repeated until the thickness reaches a highly accurate target thickness for the wet resist. The relationship of the wet and dry thicknesses can be predetermined.

The concentration of the solvent vapor should be kept high to prevent drying of the resist, yet not saturated such that the solvent may condense on a wafer 14, causing a non-uniform coating. The amount and duration of the solvent spray is a function of the duration and the quantity of the solvent in the resist which is sprayed upon wafer 14. A longer resist spray time or a higher resist dilution can use a shorter solvent spray duration.

EXAMPLE

An amount of 0.8 ml of approximate mixture of as follows:

| 2-ethoxy ethyl acetate | 5 parts |
| --- | --- |
| 4-butyrol acetone | 1 part | was sprayed into an approximately 3 liter closed chamber with an air brush at a pressure of 20 psia for a duration of 2 seconds prior to application of the resist which has a 32% solid content. The liquid resist was sprayed upon the 3 inch wafers for approximately 2 seconds. The wet resist had thickness of approximately 10 μm. When the resist coverage is increased five times by spraying liquid resist, proportionately longer, no solvent pre-spray is required. The resist used to spray the three inch wafers is about 0.05 ml per wafer. Using the conventional puddle coating process, 1 ml of resist is required, which is about 20 times more or greater than an order of magnitude. To facilitate uniform spraying of resist from nozzles 18, the wafer 14 was spun at 60 rpm and the air brush system was aimed slightly off center to deliver more material from nozzles 18 towards the periphery of the wafer 14. Spread out time ran about 20 to 30 seconds to yield satisfactory uniformity.

An optimized vapor spray coating tool can further reduce the quantity of material consumed in the coating process. It is desirable to maintain the wafer 14 spinning at a high velocity rpm during the vapor introduction, so that if any solvent drops upon the wafer 14, it will be spread out thinly and uniformly. In a manufacturing system, multiple nozzles 18 can be used to spray more material towards the outside of the wafer 14.

Spread Out Time

A very important step In this invention is to allow the resist to spread out uniformly by delaying the thickness-controlling spinning after the spray of resist from nozzles 18. The duration of the spread out time varies as a function of as follows:

1) the viscosity of the resist,
2) the force of impact of the sprayed resist droplets,
3) the vapor pressure of the solvent.

Without the spread out delay in the example cited above, the coating was found to be full of radially oriented non-uniformity.

When planarization over topography is desired, a second spread out process can be used after the resist spun off has stopped, so that resist piled up at the edges of wafer topographical features due to centrifugal force can now settle down and spread out flat over the surface of the substrate.

The resultant baked resist has an average thickness of about 1.05 μm and a standard deviation of 0.3%, whereas that of the control wafers has an average thickness of 1.3 μm and a standard deviation of 1.5% at a spin speed of 3480 rpm. The larger thickness from the control wafers confirms that the resist has started drying as soon as it forms a puddle on the wafer.

In summary, one or more nozzles is used to spray resist upon the wafer. Preferably, a spinning step, after deposition of the resist is provided for thickness and uniformity control.

During high speed spinning, in situ thickness control takes place.

The resist solvent vapor pressure above the vapor is maintained high before resist is spun off the wafer. After the desired uniformity of thickness and wet thickness are achieved, the solvent vapor can be removed during the spinning. Alternately, the solvent vapor is removed after the spinning and a second spread out. Solvent vapor is removed to promote rapid drying. The film is applied at more than 1 micrometer and spun down to 1 micrometer.

A delay time is deliberately introduced between the spraying of the coating material and the spinning steps. Ultrasonic or vibratory agitation is applied to the system during the delay time to shorten the duration of the delay time among other things. Thus the ultrasonic or vibratory agitation is applied to the system, during the delay time, before spinning.

Preferably, the substrate is spun—at a high rpm during the introduction of vapor—at a substantially lower rpm during spraying and—at the thickness-regulating rpm after spraying and spread out.

A preferred embodiment of this invention is to provide a high rpm spinning step during the introduction of the solvent vapor.

A further preferred embodiment of this invention is to provide a low rpm spinning step during spraying of the resist material onto the substrate.

During the final spinning step, solvent vapor pressure is maintained or evacuated depending upon the degree of planarization desired, with early evacuation providing higher throughput but less planarization.

A second spread out delay between the final spinning step and resist drying can be used to further planarize the resist coating but with corresponding reduction in throughput.

While this invention has been described in terms of the above embodiment(s), those skilled in the art will recognize that the invention can be practiced with modifications within the spirit and scope of the appended claims.

Having thus described the invention, what is claimed as new and desirable and desired to be secured by Letters Patent is as follows:

1. A spin coating process for producing a resist coating having a particular film thickness on a substrate, said process comprising the steps of:
    a) obtaining a substrate having a coating of a liquid resist material thereon,
    b) spinning said substrate in a vapor rich environment,
    c) measuring the resist coating thickness in situ, and
    d) providing feedback to adjust spin speed to obtain the particular film thickness of the resist coating in response to the measurement result.

2. The spin coating process of claim 1 wherein said spinning involves a cycle consisting of
    a) an initial acceleration stage,
    b) a first constant speed stage,
    c) thickness measurement during the first constant speed stage,
    d) a final acceleration stage, and
    e) a final constant speed stage,
said final constant speed being adjusted according to the measurement result at the first constant speed stage.

3. The spinning cycle of claim 2 repeated iteratively until the desired wet resist thickness is reached.

4. The spin coating process of claim 1 using polychromatic interference to measure the resist thickness.

5. The spin coating process of claim 1 using monochromatic interference to measure the resist thickness.

6. The spin coating process of claim 1 using an ellipsometer to measure the resist thickness for said thickness.

7. Apparatus for treating a polymer coated substrate to produce a polymer coating having a particular film thickness, said apparatus comprising:
    a) a support for said substrate,
    b) a chamber surrounding said substrate and said support, said chamber having a means for controlling the concentration of solvent vapor in the chamber,
    c) means for introducing a solvent vapor into said chamber,
    d) means for introducing said polymer into said chamber and applying said polymer onto said substrate,
    e) means for removing said solvent from said chamber,
    f) means for in situ thickness measurement, and
    g) feedback means to adjust spin speed to obtain the particular film thickness of the polymer coating, which feedback means is responsive to the means for in situ thickness measurement.

8. Apparatus in accordance with claim 7 wherein said support is rotatably supported for spinning.

9. Apparatus in accordance with claim 7 wherein said means for introducing includes means for vaporizing solvent.

10. Apparatus in accordance with claim 7 wherein said means for introducing said solvent vapor comprises at least one vaporizing nozzle.

11. Apparatus in accordance with claim 7 wherein said means for introducing said solvent vapor comprises at least one vaporizing nozzle, and said support is rotatably supported for spinning.

12. Apparatus for treating a polymer coated substrate to produce a polymer coating having a particular film thickness, said apparatus comprising:
    a) a support for said substrate, said support being rotatably supported for spinning,
    b) an enclosed chamber surrounding said substrate and said support,
    c) means for introducing a solvent vapor into said chamber,
    d) means for removing said solvent from said chamber comprising an evacuated chamber coupled with said enclosed chamber for removing said solvent vapor from said enclosed chamber,
    e) means for in situ thickness measurement, and
    f) feedback means to adjust spin speed to obtain the particular film thickness of the polymer coating, which feedback means is responsive to the means for in situ thickness measurement.

13. Apparatus in accordance with claim 12 comprising: at least one vaporizing nozzle for vaporizing solvent vapor.

14. Apparatus in accordance with claim 12 wherein said means for introducing comprises an auxiliary vapor chamber coupled with said enclosed chamber for providing said solvent vapor to said enclosed chamber.

15. Apparatus for coating a substrate with a polymer to produce a polymer coating having a particular film thickness, said apparatus comprising:
   a) a support for said substrate, said support being rotatably supported for spinning,
   b) a sealed chamber surrounding said substrate and said support,
   c) means for introducing a solvent vapor into said chamber,
   d) means for applying said polymer to said substrate,
   e) means for removing said solvent from said chamber,
   f) means for in situ thickness measurement, and
   g) feedback means to adjust spin speed to obtain the particular film thickness of the polymer coating, which feedback means is responsive to the means for in situ thickness measurement.

16. Apparatus in accordance with claim 15 wherein said support is rotatably supported for spinning.

17. Apparatus in accordance with claim 15 wherein said means for introducing includes means for vaporizing solvent.

18. Apparatus in accordance with claim 15 wherein said means for introducing said solvent vapor comprises at least one nozzle.

19. Apparatus in accordance with claim 15 wherein said means for introducing said solvent vapor comprises at least one vaporizing nozzle and said support is rotatably supported for spinning.

20. Apparatus in accordance with claim 15 wherein said means for applying said polymer comprises a spraying nozzle.

21. A process of spin coating a soluble coating material upon a substrate to produce a coating of the soluble material having a particular film thickness and uniformity, said process comprising:
   a) applying a solvent enriching vapor upon a substrate,
   b) subsequently spraying said coating material upon said substrate,
   c) spinning said substrate,
   d) performing in situ thickness measurement, and
   e) providing feedback to adjust the spin speed in response to the in situ thickness measurement, wherein the spin speed is adjusted to obtain the particular film thickness and uniformity of the soluble material coating.

22. The process of claim 21 wherein a spread out delay time is introduced between said spraying step and said spinning step.

23. The process of claim 21 wherein said coating material comprises resist.

24. The process of claim 21 wherein said substrate is spun at a high rpm during solvent vapor introduction.

25. The process of claim 24 wherein said substrate is spun at a substantially lower rpm during introduction of coating material.

26. The process of claim 21 wherein after a step of thickness regulating spinning, a delay time is introduced before a step of solvent vapor evacuation.

27. The process of claim 21 wherein during said spinning step and a spread out delay time, vapor pressure of said solvent enriching vapor is maintained substantially stable.

28. The process of claim 21 wherein during said spinning step, solvent vapor pressure is substantially reduced by exhaust thereof into an evacuation outlet.

29. The process of claim 21 wherein ultrasonic agitation is applied to said system, during said delay time, before spinning.

30. The process of claim 21 wherein vibratory agitation is applied to said system, during said delay time, before spinning.

* * * * *